(12) United States Patent
Tatapudi et al.

(10) Patent No.: US 11,740,795 B2
(45) Date of Patent: *Aug. 29, 2023

(54) CONFIGURABLE LINK INTERFACES FOR A MEMORY DEVICE

(71) Applicant: Micron Technology, Inc., Boise, ID (US)

(72) Inventors: Suryanarayana B. Tatapudi, Boise, ID (US); John David Porter, Boise, ID (US); Jaeil Kim, Boise, ID (US); Mijo Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/721,160

(22) Filed: Apr. 14, 2022

(65) Prior Publication Data

US 2022/0308757 A1 Sep. 29, 2022

Related U.S. Application Data

(63) Continuation of application No. 16/925,773, filed on Jul. 10, 2020, now Pat. No. 11,307,771.

(51) Int. Cl.
*G06F 3/06* (2006.01)
*G06F 13/16* (2006.01)
*G11C 7/10* (2006.01)

(52) U.S. Cl.
CPC ............ *G06F 3/061* (2013.01); *G06F 3/0655* (2013.01); *G06F 3/0676* (2013.01);
(Continued)

(58) Field of Classification Search
CPC ...... G06F 3/061; G06F 3/0655; G06F 3/0676; G06F 3/0679; G06F 13/1668;
(Continued)

(56) References Cited

U.S. PATENT DOCUMENTS 9,304,968 B2 4/2016 Noyes et al.
10,031,802 B2 7/2018 Vogt
(Continued)

FOREIGN PATENT DOCUMENTS

CN 104487957 A 4/2015
CN 105264342 A 1/2016
CN 111078156 A * 4/2020

OTHER PUBLICATIONS

Chinese Patent Office, "Notice of Allowance," issued in connection with Chinese Patent Application No. 202110766277.5 dated Nov. 21, 2022 (6 pages) (2 pages of English Translation and 4 pages of Original Document).

*Primary Examiner* — Fernando Hidalgo
(74) *Attorney, Agent, or Firm* — Holland & Hart LLP

(57) ABSTRACT

Techniques for configurable link interfaces for a memory device are described. In some examples, memory devices may require periodic link training to support data transfer with a host device at relatively fast rates. However, in some managed memory applications, memory dies of a memory device may have integrated controllers that do not support such link training, and accordingly may not support some clock rates or data rates. To support data transfers between a host device and a memory device at relatively fast clock rates or data rates without link training, a memory die may be fabricated with a configurable link interface that can support different mappings between components and operation according to different clock rates or data rates. In some examples, a memory die may be fabricated in a manner that supports configurable mappings between an array and a data channel interface that are operable according to different multiplexing and serialization.

20 Claims, 10 Drawing Sheets

(52) U.S. Cl.
CPC ........ *G06F 3/0679* (2013.01); *G06F 13/1668* (2013.01); *G11C 7/10* (2013.01); *G06F 2213/16* (2013.01)

(58) Field of Classification Search
CPC .. G06F 2213/16; G06F 3/0656; G06F 13/382; G06F 13/4291; G11C 7/10; G11C 7/222; G11C 29/022; G11C 29/023; G11C 29/028; Y02D 10/00
USPC .......................................................... 365/1
See application file for complete search history.

(56) References Cited

U.S. PATENT DOCUMENTS

| | | | |
|---|---|---|---|
| 11,307,771 B2* | 4/2022 | Tatapudi | G06F 3/0655 |
| 2008/0001898 A1* | 1/2008 | Chang | G09G 3/3688 |
| | | | 345/100 |
| 2015/0006993 A1 | 1/2015 | Vogt | |
| 2016/0217365 A1 | 7/2016 | Noyes et al. | |
| 2016/0292095 A1* | 10/2016 | Hinkle | G06F 3/0635 |
| 2020/0250113 A1 | 8/2020 | Kim et al. | |
| 2020/0272564 A1* | 8/2020 | Keeth | H01L 25/18 |

* cited by examiner

US 11,740,795 B2

CONFIGURABLE LINK INTERFACES FOR A MEMORY DEVICE

CROSS REFERENCE

The present Application for Patent is a continuation of U.S. patent application Ser. No. 16/925,773 by Tatapudi et al., entitled "CONFIGURABLE LINK INTERFACES FOR A MEMORY DEVICE," filed Jul. 10, 2020, assigned to the assignee hereof, and is expressly incorporated by reference in its entirety herein.

BACKGROUND

The following relates generally to one or more systems for memory and more specifically to configurable link interfaces for a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Memory systems may include various architectures for conveying data between a host device and a memory device. In some examples, memory devices may perform periodic link training to support data transfers at relatively fast rates (e.g., fast clock rates, fast signaling rates, fast modulation rates). However, in some managed memory applications, memory dies of a memory device may have integrated controllers that do not support such link training, and accordingly may not support some data transfer rates.

To support data transfers between a host device and a memory device at relatively fast rates without link training, a memory die may be fabricated with a configurable link interface that can support different mappings between components, or operation according to different clock rates, or various combinations thereof. In some examples, such designs may be configurable by way of one or more metal layers of a memory die which, during a manufacturing operation, can be fabricated according to one of the different mappings. In some examples, such designs may be configurable by way of metal switches, fuses, anti-fuses, or a combination thereof that may be configured (e.g., according to a configuration operation during or after the memory die is fabricated) according to one of the different mappings. In some examples, a memory die may be fabricated in a manner that supports configurable mappings between an array and a data channel interface that are operable according to different multiplexing and serialization techniques.

Features of the disclosure are initially described in the context of systems and dies as described with reference to FIGS. 1 and 2. Features of the disclosure are further described in the context of memory die architectures as well as logical and electrical configurations that relate to configurable link interfaces for a memory device as described with reference to FIGS. 3 through 6C.

Figure 1:
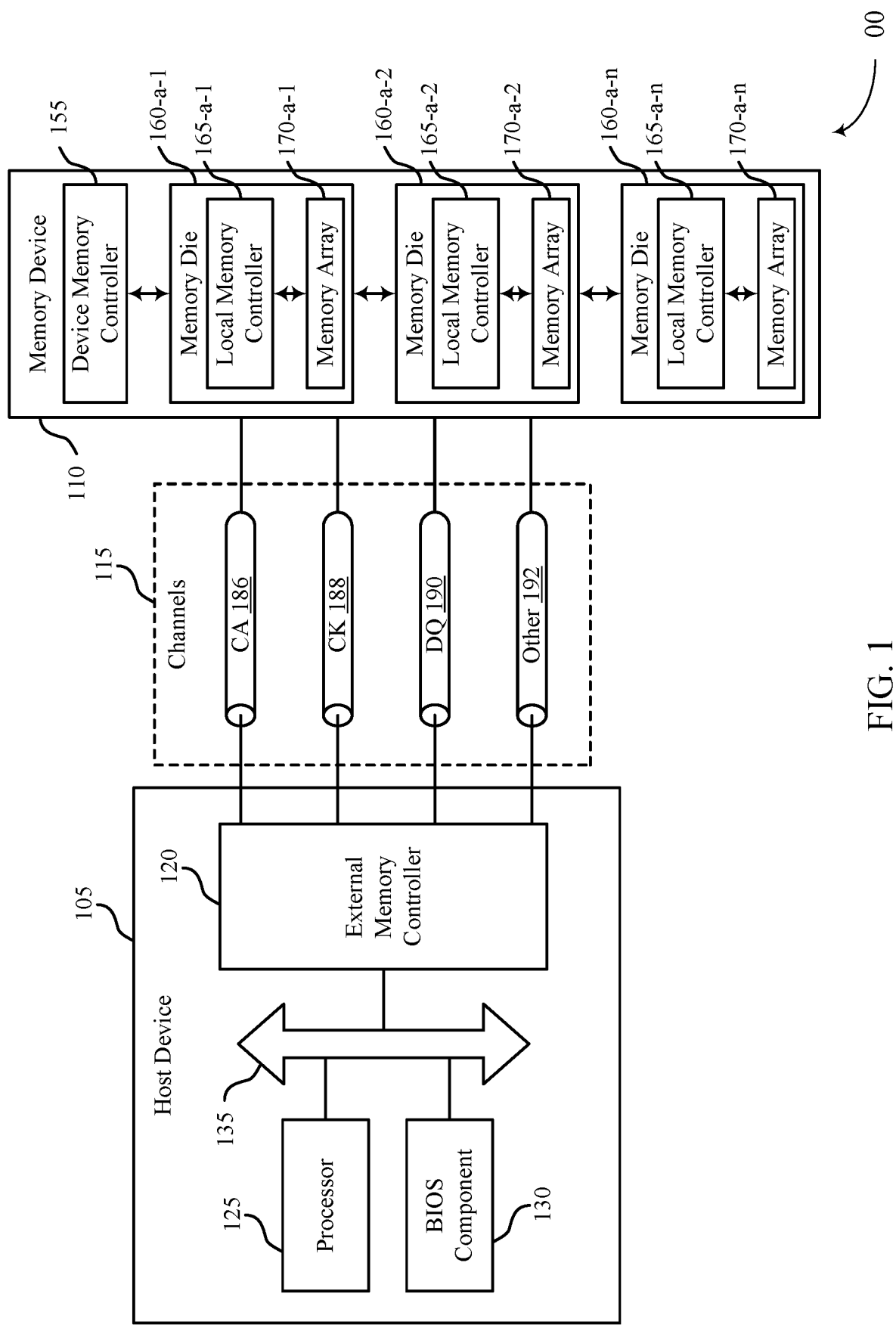
FIG. 1 illustrates an example of a system that supports configurable link interfaces for a memory device in accordance with examples as disclosed herein.

FIG. 1 illustrates an example of a system 100 that supports configurable link interfaces for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*-1, local memory controller 165-*a*-2, local memory controller 165-*a*-*n*) and a memory array 170 (e.g., memory array 170-*a*-1, memory array 170-*a*-2, memory array 170-*a*-*n*). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any number of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

Signals communicated over the channels 115, or between a memory die 160 and a device memory controller 155 or other interfacing component, may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110, or between a memory die 160 and another interfacing component. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

The system 100 may support modulation schemes that operate according to various rates (e.g., symbols per unit time). For example, the channels 115 may be configured according to a native interface, such as a low-power double data rate (LPDDR) interface, that supports relatively fast data rates (e.g., 6400 Megabits per second (Mbps) or more, via signal paths of a DQ channel). However, to support some data rates (e.g., data rates greater than 2400 Mbps) a host device 105 and a memory device 110 may perform periodic link training. Link training may include such techniques as aligning timing for transmission and reception of signals exchanged between the host device 105 and the memory device 110, such as modulation symbols exchanged over a CA channel or a DQ channel.

Link training techniques may be based at least in part on a clock signal shared between the host device 105 and the memory device 110, such as a clock signal transmitted by the host device 105 and received by the memory device 110. In some examples, the host device 105 and the memory device 110 may be configured to exchange a first clock signal associated with data exchange (e.g., a data strobe) and a second clock signal associated with access commands, and such different clock signals may be associated with different clock rates. For example, the host device 105 may be configured to transmit a write clock (WCK) signal associated with a rate of signal exchange over a DQ channel (e.g., a DQ channel modulation rate), and a CK signal associated with a rate of signal exchange over a CA channel (e.g., a CA channel modulation rate), where a WCK signal may have a clock rate that is faster than a CK signal, such as an integer multiple of the CK signal (e.g., twice as fast, four times as fast). In some examples, link training for data exchange may be based at least in part on a rate of a WCK signal, and may support data symbols being exchanged at the same rate as the WCK signal, or at various integer multiples of the rate of the WCK signal (e.g., according to double data rate associated with two DQ modulation symbol durations per WCK cycle, according to a quad data rate associated with four DQ modulation symbol durations per WCK cycle, and so on).

In some managed memory applications, a memory die 160 may interface with a logic chip in-package (e.g., within the memory device 110, which may include or be part of a device memory controller 155, or some other component that includes the memory die 160), and the logic chip may interface with an external application processor (AP) or silicon-on-chip (SoC) processor. In such managed memory applications, training internal links between a memory die 160 and the logic chip may not be supported, which may limit a data rate of such a link. To maintain a given bandwidth in the absence of link training, a memory die 160 may be configured to support a greater quantity of input/output pins and implement a data modulation scheme at a relatively slower rate.

In accordance with examples as disclosed herein, a memory die 160 may be fabricated with a configurable link interface (e.g., a configurable interface with a device memory controller 155 or other logic chip) that can support different mappings between components, or operation according to different clock rates, or a combination thereof. In some examples, such designs may be configurable by way of one or more metal layers or switches of a memory die 160 which, during a manufacturing operation, can be fabricated according to one of the different mappings. In some examples, such designs may be configurable by way of fuses, anti-fuses, other configurable interconnections, or various combinations thereof that may be configured (e.g., according to a configuration operation during or after the memory die is fabricated) according to one of the different mappings. In some examples, a memory die 160 may be fabricated in a manner that supports configurable mappings between a memory array 170 and a data channel interface (e.g., of a local memory controller 165) that are operable according to different multiplexing and serialization. Such techniques may support converting a native interface, such as a native LPDDR5 interface, into a relatively slower and more parallel custom interface for a managed memory application. In some examples, either of an LPDDR5 interface or a custom interface may be supported by a memory die 160 with relatively little logic overhead, relatively few metal switches, or other configurations. In some examples, such a memory die 160 may be configurable to support one of two or more interfaces with no die size or power impact.

Figure 2:
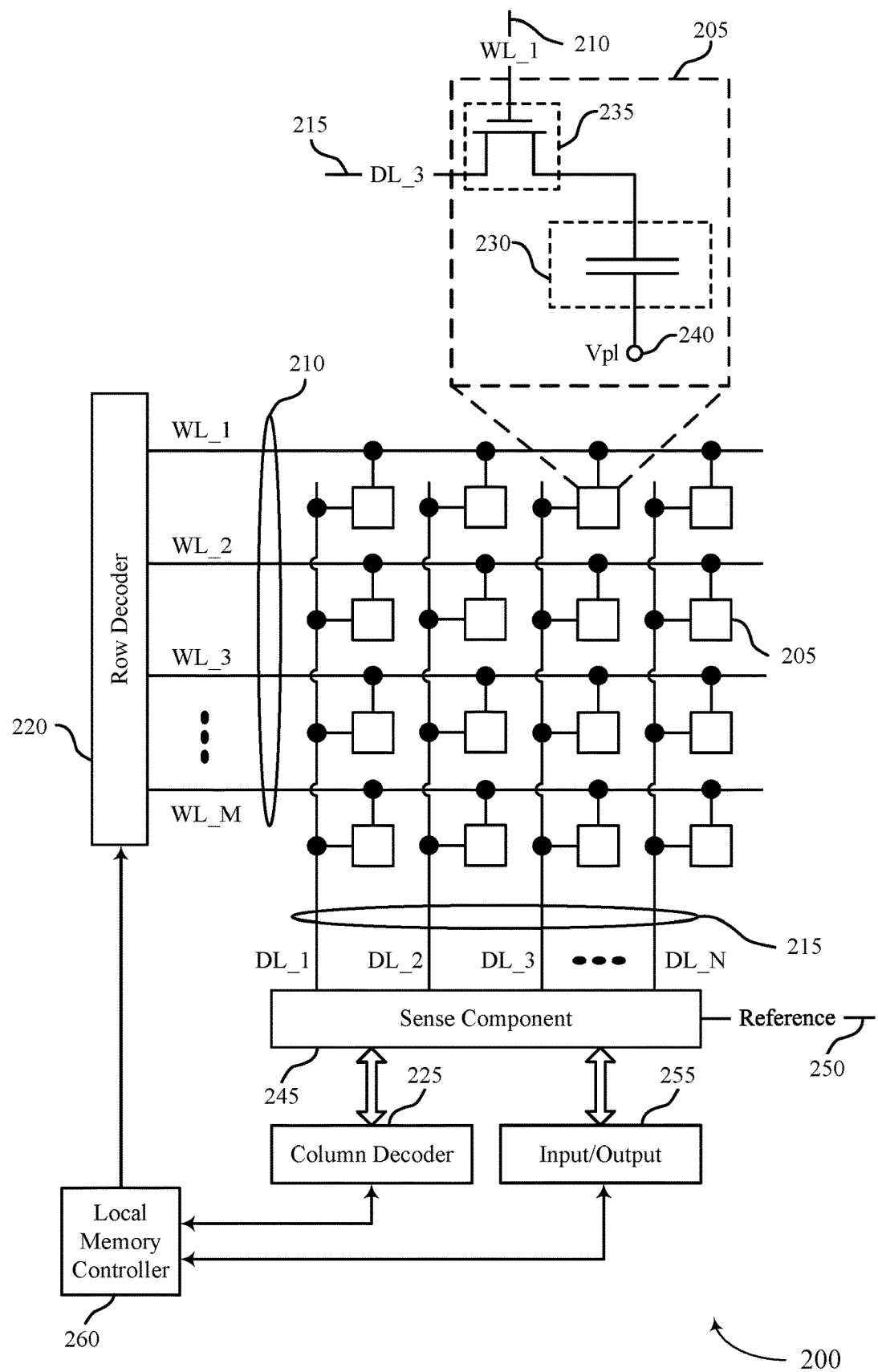
FIG. 2 illustrates an example of a memory die that supports configurable link interfaces for a memory device in accordance with examples as disclosed herein.

FIG. 2 illustrates an example of a memory die 200 that supports configurable link interfaces for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed, or materials that store another physical characteristic, such as a resistance or threshold voltage, may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output (I/O) component 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some managed memory applications, the memory die 200 may interface with a logic chip in-package (e.g., via a local memory controller 260, via an I/O component 255), and the logic chip may interface with an external AP or SoC processor. In such managed memory applications, training internal links between the memory die 200 and the logic chip may not be supported, which may limit a data rate of such a link. To maintain a given bandwidth in an absence of link training, the memory die 200 may be configurable to support a greater quantity of input/output pins and implement a data modulation scheme at a relatively slower rate.

In accordance with examples as disclosed herein, the memory die 200 may be fabricated with a configurable link interface (e.g., a configurable interface of the local memory controller 260, a configurable interface of the I/O component 255) that can support different mappings between components, or operation (e.g., modulation, multiplexing, serialization) according to different clock rates, or a combination thereof. In some examples, such designs may be configurable by way of one or more metal layers or switches of the memory die 200 which, during a manufacturing operation, can be fabricated according to one of the different mappings. In some examples, such designs may be configurable by way of fuses, anti-fuses, or a combination thereof that may be configured (e.g., according to a configuration operation during or after the memory die is fabricated) according to one of the different mappings. In some examples, the memory die 200 may be fabricated in a manner that supports configurable mappings between the memory cells 205 (e.g., of a memory array 170) and a data channel interface (e.g., of the local memory controller 260, of the I/O component 255) that are operable according to different multiplexing and serialization. Such techniques may support converting a native interface, such as a native LPDDR5 interface, into a relatively slower and more parallel custom interface for a managed memory application. In some examples, either of an LPDDR5 interface or a custom interface may be supported by the memory die 200 with relatively little logic overhead, relatively few metal switches, or other configurations. In some examples, the memory die 200 may be configurable to support one of two or more interfaces with no die size or power impact.

Figure 3:
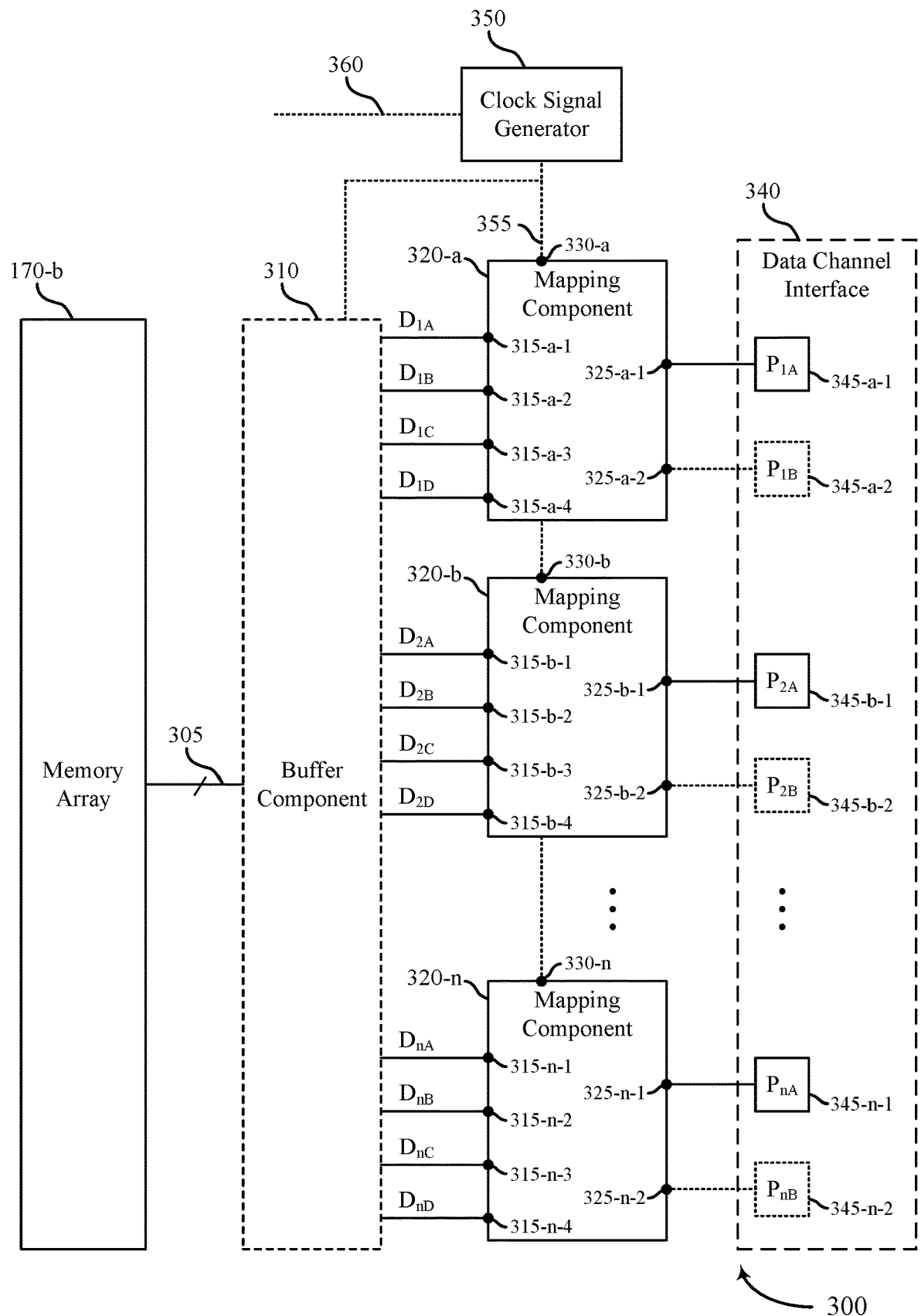
FIG. 3 illustrates an example of an architecture that supports configurable link interfaces for a memory device in accordance with examples as disclosed herein.

FIG. 3 illustrates an example of an architecture 300 that supports configurable link interfaces for a memory device in accordance with examples as disclosed herein. The architecture 300 may illustrate components of a memory die, such as a memory die 160 or a memory die 200 described with reference to FIGS. 1 and 2. The architecture 300 includes a memory array 170-b, which may be an example of a memory array 170 described with reference to FIG. 1. The memory array 170-b may include an array of memory cells 205 as described with reference to FIG. 2, which may be arranged as a plurality of rows and a plurality of columns. In some examples, the memory array 170-b may include or be associated with (e.g., coupled with) a read circuit configured to read a memory word including bits arranged according to an order of the plurality of columns. Additionally or alternatively, the memory array 170 may include or be associated with (e.g., coupled with) a write circuit configured to write a memory word, wherein bits of the memory word are arranged according to an order of the plurality of columns.

The architecture 300 may also include a buffer component 310 (e.g., one or more first-in-first-out (FIFO) buffers), and a data channel interface 340 configured to convey logic state information (e.g., bits of a memory word). The data channel interface 340 may include a plurality of pins 345, which may be grouped into a plurality of groups of adjacent pins (e.g., a group including pins 345-a-1 and 345-a-2, a group including pins 345-b-1 and 345-b-2, and so on). The architecture 300 may also include a plurality of mapping components 320 coupled with or between the buffer component 310 and the data channel interface 340. In some examples of the architecture 300, the buffer component 310 may be omitted, and the mapping components 320 may be coupled with or between the data channel interface 340 and another interfacing component (e.g., a sense component 245, a column multiplexer) for communicating information with the memory array 170-b. Additionally or alternatively, aspects of the buffer component 310 may be distributed among the mapping components 320. The architecture 300 also includes a clock signal generator 350 which may support timing of information exchange (e.g., a modulation rate, a multiplexing rate, a serialization rate) between the memory array 170-b or the buffer component 310 and the data channel interface 340.

The buffer component 310 may exchange information with the memory array 170-b over a bus 305 (e.g., a data bus), where such information may include various combinations of read information, write information, refresh information, or information related to various memory management techniques. In some examples, the buffer component 310 may be configured with slots or rows (e.g., of a plurality of buffers, a plurality of cache slots, a plurality of storage elements) that support a FIFO operation. In some examples, the buffer component 310 may have certain components that support FIFO operation for reading information from the memory array 170-b, or certain components that support FIFO operation for writing information to the memory array 170-b, or both.

The buffer component 310 may be associated with a plurality of data lines (e.g., $D_{1A}$ through $D_{nD}$) that are coupled with nodes 315 of respective mapping components 320 (e.g., nodes 315-a-1 through 315-n-4 associated with mapping components 320-a through 320-n, buffer nodes, array nodes). In some examples, subsets of the plurality of data lines may be associated with a respective mapping component 320, such as the 4:1 association of data lines $D_{1A}$, $D_{1B}$, $D_{1C}$, and $D_{1D}$ with the mapping component 320-a. Although illustrated as including four data lines per mapping component 320-a, the techniques described herein are applicable to any quantity of data lines per mapping component 320, where an applicable ratio of data lines to mapping components 320 may correspond to various multiplexing and serialization configurations as described herein.

The mapping components 320 may be configurable to support different mappings between the buffer component 310 and the data channel interface 340. For example, the data channel interface 340 may include a plurality of pins 345 (e.g., pins 345-a-1 through 345-n-2), which may be associated with physical signal path terminations (e.g., pads, balls, sockets) of a memory die (e.g., of a data path, of a data channel, of a data interface). In various examples, pins 345-a-1 through 345-n-2 may be denoted as $P_{1A}$ through $P_{nB}$, as illustrated, or DQ1A through DQnB, among other notations. Each of the pins 345 may be coupled with a respective node 325 of a mapping component 320 (e.g., pin 345-a-1 coupled to node 325-a-1, and so on). In some examples, subsets of the plurality of pins 345 may be associated with a respective mapping component 320, such as the 2:1 association of pins $P_{1A}$ and $P_{1B}$ with the mapping component 320-a. Although illustrated as including two pins 345 or two nodes 325 per mapping component 320, the techniques described herein are applicable to any quantity of pins 345 per mapping component 320, where an applicable ratio of pins 345 to mapping components 320 may correspond to various multiplexing and serialization configurations as described herein.

The clock signal generator 350 may be configured to generate one or more internal clock signals for triggering or otherwise coordinating aspects of a modulation scheme, a multiplexing scheme, a serialization scheme, or other operations by the architecture 300 (e.g., based on rising edges of respective clock signals, falling edges of respective clock signals, or some combination thereof). In some examples, such an internal clock signal may be passed to each of the mapping components 320 via a clock bus 355 (e.g., coupled with respective clock nodes 330) which may have any quantity of one or more signal paths to convey the one or more generated internal clock signals. Additionally or alternatively, the clock signal generator 350 may pass one or more clock signals to the buffer component 310 for coordinating aspects of multiplexing or serialization of information exchanged with the memory array 170-b.

The clock signal generator 350 may generate or otherwise communicate one or more internal clock signals on the clock bus 355 based at least in part on an external clock channel 360 (e.g., an external clock input). For example, the clock signal generator 350 may receive a WCK signal via the external clock channel 360 (e.g., from a host device 105, from an AP or SoC processor). In one configuration, the clock signal generator 350 may generate two internal clock signals over the clock bus 355 (e.g., a 2-phase clock, a full-speed clock, a DDR clock, a first quantity of divided phases of the external clock channel 360), which may have signals denoted WCK_t and WCK_c that are separated in phase by 180 degrees. In another configuration, the clock signal generator 350 may generate four internal clock signals over the clock bus 355 (e.g., a 4-phase clock, a quad data rate (QDR) clock, a second quantity of divided phases of the external clock channel 360), which may have signals denoted WCK0, WCK90, WCK180, and WCK270 that are separated in phase by 90 degrees. In some examples, the clock signal generator 350 may be configured to receive signaling associated with a differential clock over the external clock channel 360, such as receiving WCK_t and WCK_c signals over the external clock channel 360. In one configuration the clock signal generator 350 may be configured to pass the WCK_t and WCK_c signals over the clock bus 355, and in another configuration the clock signal generator 350 may be configured to further divide the divided clock to generate WCK0, WCK90, WCK180, and WCK270 signals for communication over the clock bus 355. In some examples, the clock signal generator 350 may be fabricated to support two or more clock rates, speeds, or divisions, but may be set or configured to generate a single clock rate, speed, or division by way connections of a metal level, metal switches, fuses or anti-fuses, a mode register, or other configurations, which may correspond to a setting or configuration of the mapping components 320.

The nodes 315 and the nodes 325 of the mapping components 320 may be interconnected to support various mappings between the buffer component 310 and the data channel interface 340. For example, the mapping components 320 may be configured for different mappings between the nodes 315 and the nodes 325, including various intervening components of the mapping components 320 such as buffers, drivers, or other components, by way of interconnections of a metal layer, metal switches, fuses, anti-fuses, or other interconnection techniques.

In one example, a first mapping of the mapping components 320 may map each of the respective nodes 315 to a first quantity of the nodes 325 or pins 345, such as mapping each of the nodes 315-a-1 through 315-a-4 of the mapping component 320-a to the node 325-a-1 (e.g., pin 345-a-1). In one example, such a mapping of the mapping components 320-a through 320-n may correspond to a native LPDDR5 interface having 16 pins 345 (e.g., pins $P_{1A}$, $P_{2A}$, . . . , and $P_{16A}$, where n=16), and a burst length of 16 bits (e.g., a first quantity of bits of information output at or input to the active pins 345). Such a mapping may also be associated with a 4-phase clock from the clock signal generator 350 to support data serialization and deserialization. In the first mapping, some of the pins 345 (e.g., pins $P_{1B}$, $P_{2B}$, . . . , and $P_{16B}$) may be idled, inactive, or disabled.

In another example, a second mapping of the mapping components 320 may map each of the nodes 315 to a second quantity of the nodes 325 or pins 345, such as dividing the nodes 315-a-1 through 315-a-4 of the mapping component 320-a between the nodes 325-a-1 and 325-a-2 (e.g., between the pins 345-a-1 and 345-a-2). In one example, such a mapping of the mapping components 320-a through 320-n may correspond to a native custom interface having 32 pins 345 (e.g., pins $P_{1A}$, $P_{1B}$ $P_{2A}$, $P_{2B}$, . . . , $P_{16A}$, and $P_{16B}$, where n=16), and a burst length of 8 bits (e.g., a second quantity of bits of information output at or input to the active pins 345). Such a mapping may also be associated with a 2-phase clock from the clock signal generator 350 to support data serialization and deserialization, which may be slower than the four phase clock corresponding to the first mapping, or otherwise associated with a slower rate (e.g., clock rate, data rate) on each of the pins 345. In other words, the second mapping may support an x16 DQ to x32 DQ conversion, splitting a native LPDDR5 I/O path into two parallel paths operating at half the clock speed as the first mapping. In some examples, such techniques may support the architecture maintaining a target data rate normally associated with a relatively faster clock, despite using a slower clock speed that may not require link training.

Figure 4A:
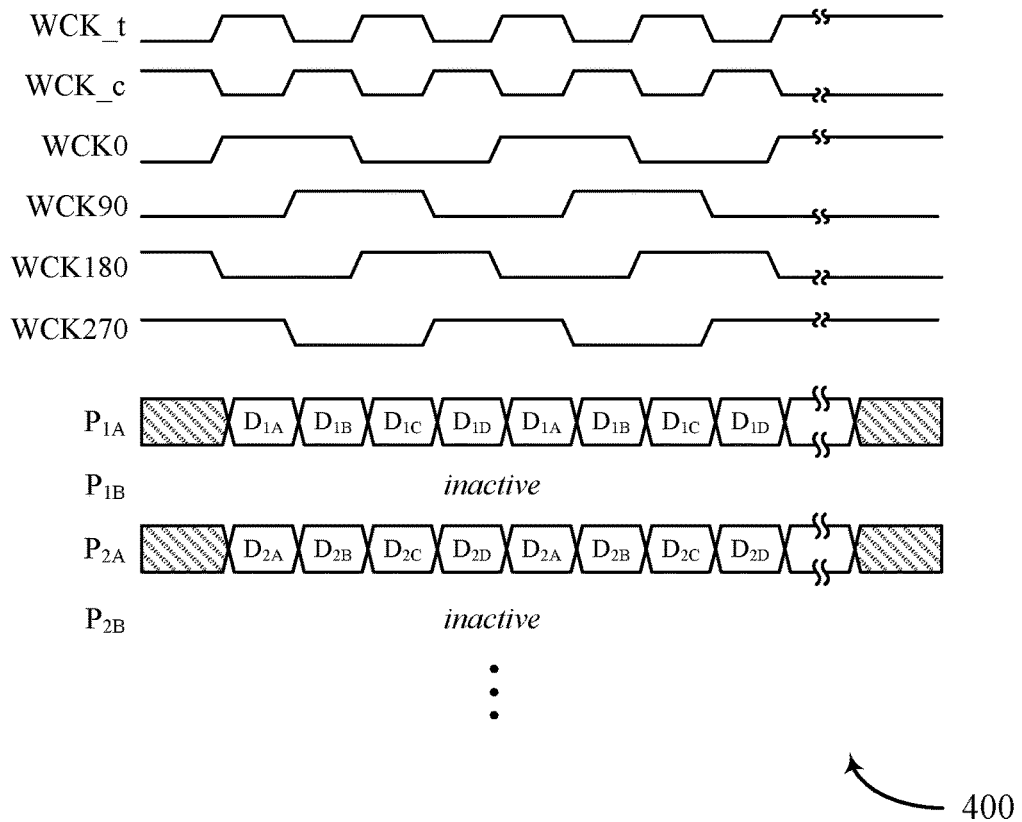
FIGS. 4A and 4B illustrate examples of data serialization associated with configurable link interfaces for a memory device in accordance with examples as disclosed herein.
Figure 4B:
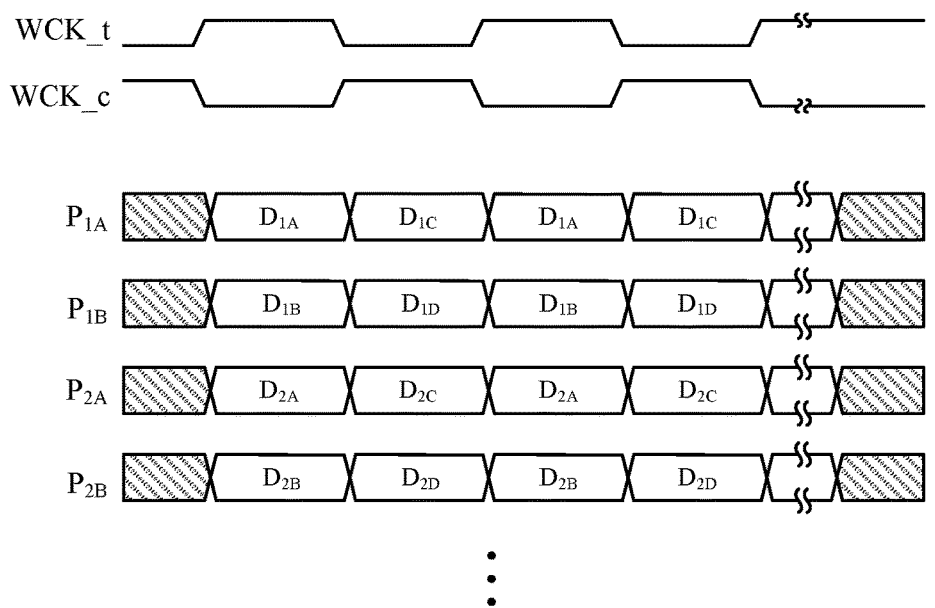

FIGS. 4A and 4B illustrate examples 400 and 450 of data serialization associated with configurable link interfaces for a memory device in accordance with examples as disclosed herein. The examples 400 and 450 may correspond to different mappings of the mapping components 320 of the architecture 300 described with reference to FIG. 3, and show how information (e.g., modulation symbols) of various data lines may be conveyed via pins 345. Each of the examples 400 and 450 may be associated with different modulation rates, corresponding to a respective mapping of the mapping components 320, which may be based on a same external clock signal received over an external clock channel 360 (e.g., a WCK signal). Each of the examples 400 and 450 may be applicable to serialization of read operations, serialization of write operations, or both.

FIG. 4A illustrates an example 400 of data serialization according to a configurable link interface, which may correspond to the first mapping of mapping components 320 described with reference to FIG. 3. Example 400 illustrates a modulation scheme as applied to pins $P_{1A}$, $P_{1B}$, $P_{2A}$, and $P_{2B}$, , but example 400 may be extended to any quantity of pins 345, such as a native LPDDR5 interface having 16 pins 345 (e.g., pins $P_{1A}$, $P_{2A}$, . . . , and $P_{16A}$, where n=16). Example 400 may be associated with a 4-phase clock (e.g., associated with clock signals WCK0, WCK90, WCK180, and WCK270) from a clock signal generator 350 to support a rate of data serialization (e.g., a modulation rate) on the pins 345. In various examples, clock signals of such a 4-phase clock may be configured to be half the rate of an input clock signal (e.g., WCK, or WCK_t, as illustrated), or one quarter of the rate of an input clock signal, among other examples, and may be configured to support a data modulation rate on each pin 345 that is twice as fast as an input clock signal (e.g., WCK, or WCK_t, as illustrated). In some examples, such a 4-phase clock may be based at least in part on a two-phase or differential input clock, such as an external clock bus 360 that provides signals WCK_t and WCK_c, as illustrated in the example 400. In some examples, modulation according to such a clock rate or data rate may require link training with a device coupled with the associated memory die. In the first mapping of example 400, some of the pins 345 (e.g., pins $P_{1B}$, $P_{2B}$, . . . , and $P_{16B}$, ) may be idled, inactive, or disabled.

In example 400, data may be serialized on a respective pin 345, from each of the data lines corresponding to the given mapping, according to the 4-phase clock rate. For example, according to a sequence of rising edges on WCK0, WCK90, WCK180, and WCK270, the pin $P_{1A}$ may be serialized with data associated with the data line $D_{1A}$, then the data line $D_{1B}$, then the data line $D_{1C}$, then the data line $D_{1D}$. Although serialization for only two cycles of the 4-phase clock signals are shown, such a serialization pattern may be extended to any quantity of cycles of the 4-phase clock signals. In one example, the data serialization of example 400 may be associated with a burst length of 16 bits, corresponding to four cycles of the 4-phase clock signals. In some examples, such a burst length may be associated with each of the data lines being mapped to four respective rows or slots of a FIFO buffer (e.g., of a buffer component 310).

FIG. 4B illustrates an example 450 of data serialization according to a configurable link interface, which may correspond to the second mapping of mapping components 320 described with reference to FIG. 3. Example 450 illustrates a modulation scheme as applied to pins $P_{1A}$, $P_{1B}$, $P_{2A}$, and $P_{2B}$, but example 450 may be extended to any quantity of pins 345, such as a custom interface having 32 pins 345 (e.g., pins $P_{1A}$, $P_{1B}$ $P_{2A}$, $P_{2B}$, . . . $P_{16A}$, and $P_{16B}$, where n=16). Example 450 may be associated with a 2-phase clock (e.g., associated with clock signals WCK_t and WCK_c) from a clock signal generator 350 to support a rate of data serialization (e.g., a modulation rate) on the pins 345. In some examples, clock signals of such a 2-phase clock may be configured with a same rate as the input clock signal (e.g., WCK, or WCK_t, as illustrated), and may be configured to support a data modulation rate on each pin 345 that is twice as fast as an input clock signal (e.g., WCK, or WCK_t, as illustrated). In some examples, modulation according to such a clock rate or data rate may not require link training with a device coupled with the associated memory die. For example, the example 450 may be configured according to clock signals WCK_t and WCK_c, or other input clock signals, that operate more slowly than in the example 400 (e.g., at half the rate of the example 400).

In example 450, data may be serialized on a respective pin 345, from each of the data lines corresponding to the given mapping, according to the 2-phase clock rate. For example, according to a sequence of rising edges on WCK_t and WCK_c, the pin $P_{1A}$ may be serialized with data associated with the data line $D_{1A}$ and then the data line $D_{1C}$, and the pin $P_{1B}$ may be serialized with data associated with the data line $D_{1B}$ and then the data line $D_{1D}$. Although serialization for only two cycles of the 2-phase clock signal are shown, such a serialization pattern may be extended to any quantity of cycles of the 2-phase clock signals. In one example, the data serialization of example 450 may be associated with a burst length of 8 bits, corresponding to four cycles of the 2-phase clock signals. In some examples, like those described with reference to example 400, such a burst length may also be associated with each of the data lines being mapped to four respective rows or slots of a FIFO buffer (e.g., of a buffer component 310).

In some examples, the example 450 of data serialization may support reading information from the memory array 170-b described with reference to FIG. 3. For example, the mapping components 320 may include a plurality of multiplexers between a read circuit and the data channel interface 340. The multiplexers may be configured to serialize, for each group of pins (e.g., a first group including pins $P_{1A}$ and $P_{1B}$, a second group including pins $P_{2A}$ and $P_{2B}$), a first subset of multiple bits of a memory word to a first pin (e.g., serializing bits associated with data lines $D_{1A}$ and $D_{1C}$ to the pin $P_{1A}$) and a second subset of the multiple bits of the memory word to a second pin (e.g., serializing bits associated with data lines $D_{1B}$ and $D_{1B}$ to the pin $P_{1B}$), where the first subset of the multiple bits and the second subset of the multiple bits include interleaved subsets of bits of the memory word according to the order of the bits of the memory word.

In some examples, the example 450 of data serialization may support writing information to the memory array 170-b described with reference to FIG. 3. For example, the mapping components 320 may include a plurality of demultiplexers between the data channel interface 340 and a write circuit. The demultiplexers may be configured to deserialize, for each group of pins (e.g., a first group including pins $P_{1A}$ and $P_{1B}$, a second group including pins $P_{2A}$ and $P_{2B}$), a first subset of multiple bits of a memory word from a first pin (e.g., deserializing bits associated with data lines $D_{1A}$ and $D_{1C}$ from the pin $P_{1A}$) and a second subset of the multiple bits of the memory word from a second pin (e.g., deserializing bits associated with data lines $D_{1B}$ and $D_{1B}$ from the pin $P_{1B}$), where the first subset of the multiple bits and the second subset of the multiple bits include interleaved subsets of bits of the memory word according to the order of the bits of the memory word.

Figure 5A:
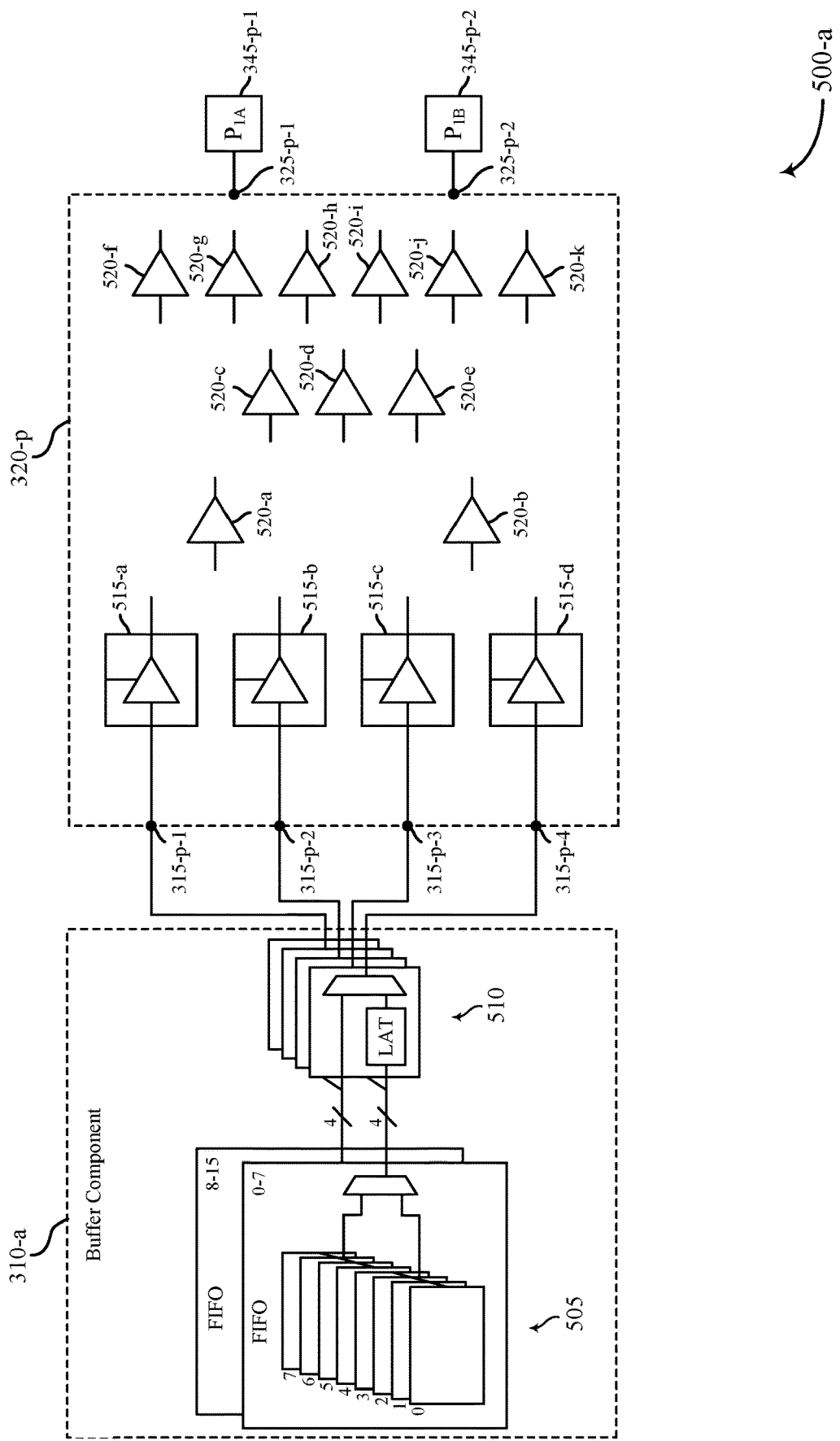
FIGS. 5A through 5C illustrate examples of a configurable output path that supports configurable link interfaces for a memory device in accordance with examples as disclosed herein.
Figure 5B:
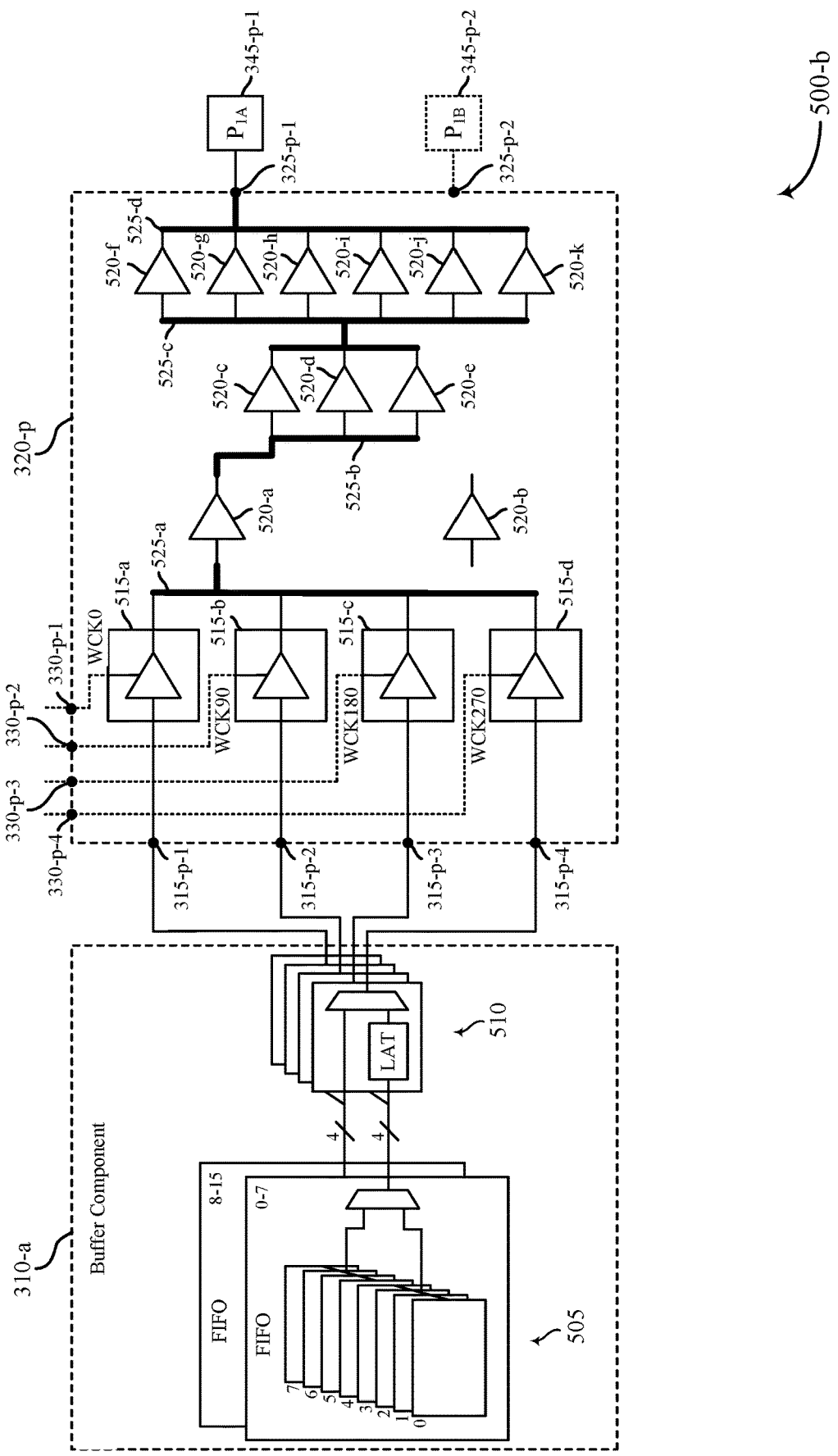
Figure 5C:
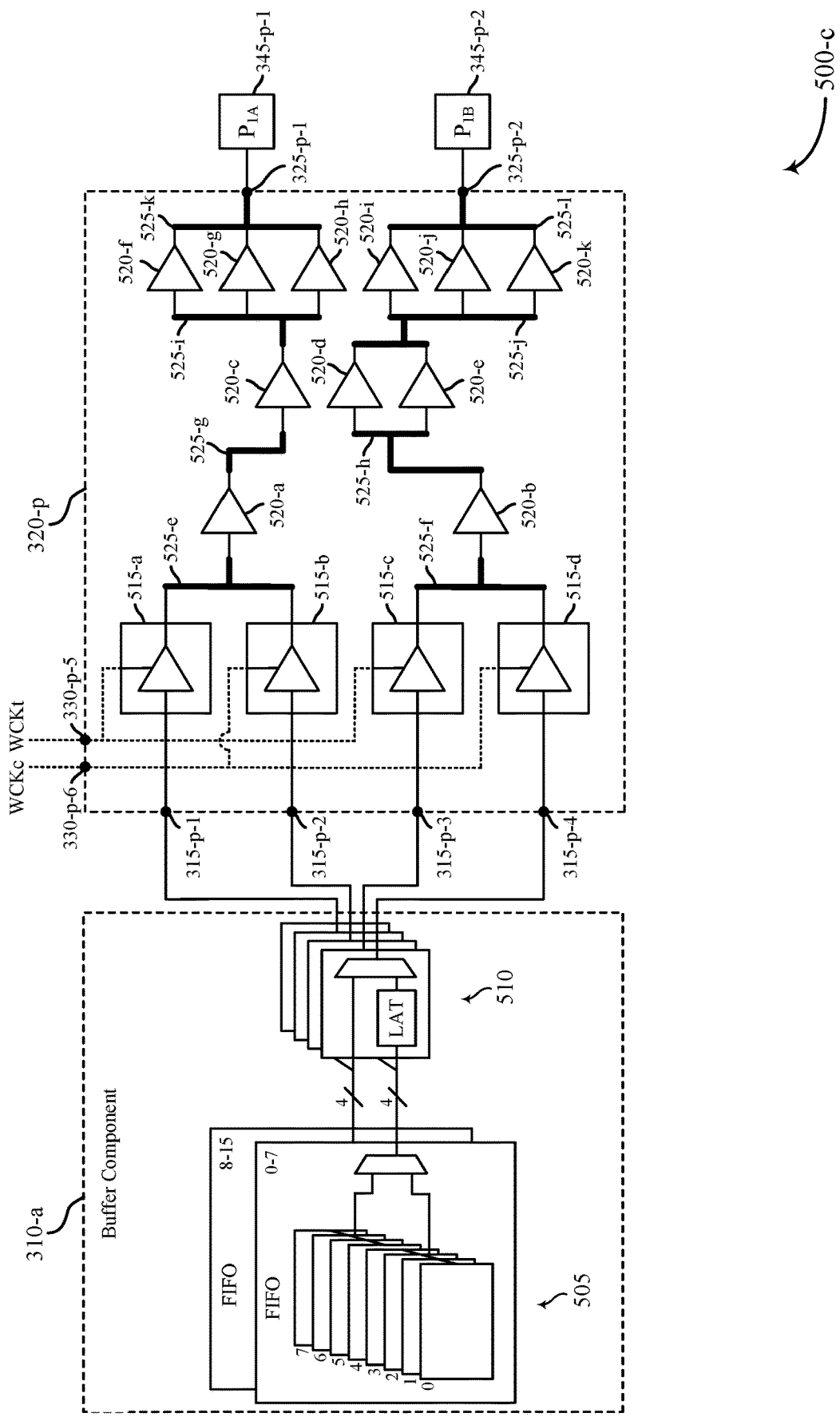

FIGS. 5A through 5C illustrate examples of a configurable output path 500 that supports configurable link interfaces for a memory device in accordance with examples as disclosed herein. The configurable output path 500 illustrates components that may be configured to support read operations (e.g., reading information from a memory array 170). The configurable output path 500 includes a buffer component 310-a that may be coupled with a memory array 170 (not shown), and a mapping component 320-p configurable to support different mappings between the illustrated nodes 315-p and 325-p. The configurable output path 500 illustrates an example of a single mapping component 320-p, but a configurable output path 500 may include any quantity of mapping components 320 to support various data bus widths.

The buffer component 310-a may include a set of FIFO buffers 505 and a set of multiplexers 510. In some examples, the set of FIFO buffers 505 may be associated with 16 slots or addresses, and divided into a first block associated with a first set of slots or addresses (e.g., slots 0-7) and a second block associated with a second set of slots or addresses (e.g., slots 8-15). In some examples, subsets of slots of a given block (e.g., a subset including slots 0-3, a subset including slots 4-7) may be coupled or serialized via a multiplexer, which may be coupled with one of the set of multiplexers 510 (e.g., via a bus having four signal paths). Each of the set of multiplexers 510 may be coupled with a respective one of the nodes 315-p (e.g., via a data line).

The mapping component 320-p may include a set of buffers 515 (e.g., buffers 515-a through 515-d), each of which may have an input coupled with a respective node 315-p. The inputs of the buffers 515 may thus be coupled with a memory array 170, and be configured to receive logic state information from the memory array 170. The buffers 515 may be coupled with the node 325-p-1, or the node 325-p-2, or both, according to various supported mapping configurations. For example, a first mapping may map the buffers 515-a through 515-d to the node 325-p-1, and a second mapping may divide the buffers 515-b through 515-d between the node 325-p-1 and the node 325-p-2. Although the example of mapping component 320-p includes 4 buffers 515, a mapping component 320 in accordance with the described techniques may include any quantity of buffers 515.

In some examples, the buffers 515 may be tri-state buffers having a respective control input. The respective control inputs may be provided with a clock signal according to various supported mapping configurations. For example, a first mapping may map the control inputs for the buffers 515 to one or more first clock signals associated with output of logic state information according to a first clock rate (e.g., a first output rate, a first data rate at the pins 345), and a second mapping may map the control inputs for the buffers 515 to one or more second clock signals associated with output of the logic state information according to a second clock rate (e.g., a second output rate, a second date rate at the pins 345) that is different than the first clock rate.

The mapping component 320-p may also include a set of drivers 520 (e.g., drivers 520-a through 520-k, output drivers) which may support driving a signal on the nodes 325-p or pins 345-p to support signaling or modulation according to various termination resistances. Although the example of mapping component 320-p includes 11 drivers 520, a mapping component 320 in accordance with the described techniques may include any quantity of drivers 520, or may omit driver 520.

FIG. 5A illustrates configurable output path 500-a, a configuration without interconnections between the components of the mapping component 320-p. In other words, configurable output path 500-a illustrates an example where a mapping between nodes 315-*p* and 325-*p* has not yet been established. In some examples, the configurable output path 500-*a* illustrates an intermediate fabrication configuration, such as a configuration which has not yet had an interconnecting metal layer deposited, or a configuration where interconnections by way of fuses or anti-fuses has not yet been established. Thus, the configurable output path 500-*a* illustrates an example of a configuration that may support one or a plurality of mappings between the nodes 315-*p* and the nodes 325-*p*.

FIG. 5B illustrates configurable output path 500-*b*, a configuration with a first mapping or interconnection between the components of the mapping component 320-*p*. In other words, configurable output path 500-*b* illustrates an example where a mapping between nodes 315-*p* and 325-*p* has been established. The configurable output path 500-*b* may correspond to the first mapping of mapping components 320 described with reference to FIG. 3, where each of the nodes 315-*p*-1 through 315-*p*-4 may be mapped to the node 325-*p*-1 (e.g., the pin 345-*p*-1, a single node or pin). In the example of configurable output path 500-*b*, the pin 345-*p*-2 may be idled, inactive, or disabled.

The mapping of configurable output path 500-*b* (e.g., of the mapping component 320-*p*) may be supported by way of interconnections 525 (e.g., interconnections 525-*a* through 525-*d*), which may illustrate interconnections by way of a metal level, metal switches, fuses, anti-fuses, or other forms of interconnection, or various combinations thereof. In some examples, the configurable output path 500-*b* may illustrate an example of a mapping used to support a native LPDDR5 interface (e.g., according to an x16 DQ interface associated with 16 of the mapping components 320-*p*, 16 of the pins 345-*p*-1, and so on). In some examples, the configurable output path 500-*b* may be used to support a burst length of 16 bits, which may correspond to a data rate of 4800 Mbps on the pin 345-*p*-1.

The configurable output path 500-*b* may be associated with a 4-phase clock from a clock signal generator 350 to support a rate of output data serialization (e.g., a modulation rate) on the pins 345-*p*-1 that is two times as fast as an external clock signal, or four times as fast as an external clock signal, among other examples. For example, four phases of internal clock signals may be provided to the buffers 515 via respective clock nodes 330-*p*, with each of the clock signals triggering a respective one of the buffers 515. In some examples, the implementation of the 4-phase clock, or the associated data rate at each of the pins 345, may involve link training to support a relatively high data rate.

A data signal from a triggered buffer 515 (e.g., one of buffers 515-*a* through 515-*d*) may be provided to the driver 520-*a*, and an output of the driver 520-*a* may be provided, in parallel, as an input to each of the drivers 520-*c*, 520-*d*, and 520-*e*. The collective outputs of the drivers 520-*c*, 520-*d*, and 520-*e* may be provided, in parallel, as an input to each of the drivers 520-*f* through 520-*k*, and the collective outputs of the drivers 520-*f* through 520-*k* may be provided to the pin 345-*p*-1. In the example of configurable output path 500-*b*, the interconnection of drivers 520 to a single pin 345-*p*-1 may support signal modulation for a relatively low termination resistance (e.g., a 40 Ohm termination resistance).

FIG. 5C illustrates configurable output path 500-*c*, a configuration with a second mapping or interconnection between the components of the mapping component 320-*p*. In other words, configurable output path 500-*c* illustrates an example where a mapping between nodes 315-*p* and 325-*p* has been established. The configurable output path 500-*c* may correspond to the second mapping of mapping components 320 described with reference to FIG. 3, where the nodes 315-*p*-1 through 315-*p*-4 may be mapped to either the node 325-*p*-1 (e.g., the pin 345-*p*-1) or the node 325-*p*-2 (e.g., the pin 345-*p*-2).

The mapping of configurable output path 500-*c* (e.g., of the mapping component 320-*p*) may be supported by way of interconnections 525 (e.g., interconnections 525-*e* through 525-*l*), which may illustrate interconnections by way of a metal layer, metal switches, fuses, anti-fuses, or other forms of interconnection, or various combinations thereof. In some examples, the configurable output path 500-*c* may illustrate an example of a mapping used to support a custom interface (e.g., according to an x32 DQ interface associated with 32 of the mapping components 320-*p*, 32 of the pins 345-*p*-1, and so on). In some examples, the configurable output path 500-*c* may be used to support a burst length of 8 bits, which may correspond to a data rate of 2400 Mbps on each of the pins 345-*p*-1 and 345-*p*-2, for an aggregate throughput of 4800 Mbps via the mapping component 320-*p*.

The configurable output path 500-*c* may be associated with a 2-phase clock from a clock signal generator 350 to support a rate of output data serialization (e.g., a modulation rate) on each of the pins 345-*p*-1 and 345-*p*-2 that is two times as fast as an external clock signal, among other examples. For example, two phases of internal clock signals may be provided to the buffers 515 via respective clock nodes 330-*p*, with each of the clock signals triggering two of the buffers 515. In some examples, the implementation of the 2-phase clock, or the associated data rate at each of the pins 345, may not involve link training to support a relatively high data rate.

A first data signal from a triggered buffer 515 (e.g., one of buffers 515-*a* or 515-*b*) may be provided to the driver 520-*a*, and an output of the driver 520-*a* may be provided as an input to the driver 520-*c*. The output of the driver 520-*c* may be provided, in parallel, as an input to each of the drivers 520-*f*, 520-*g*, and 520-*h*, and the collective outputs of the drivers 520-*f*, 520-*g*, and 520-*h* may be provided to the pin 345-*p*-1. A second data signal from a triggered buffer 515 (e.g., one of buffers 515-*c* or 515-*d*) may be provided to the driver 520-*b*, and an output of the driver 520-*b* may be provided, in parallel, as an input to each of the drivers 520-*d* and 520-*e*. The collective output of the drivers 520-*d* and 520-*e* may be provided, in parallel, as an input to each of the drivers 520-*i*, 520-*j*, and 520-*k*, and the collective outputs of the drivers 520-*i*, 520-*j*, and 520-*k* may be provided to the pin 345-*p*-2. Thus, the configurable output path 500-*c* may illustrate an example of splitting the configurable output path into two outputs. In the example of configurable output path 500-*c*, the interconnection of drivers 520 to the two pins 345-*p*-1 and 345-*p*-2 may support signal modulation for a relatively higher termination resistance (e.g., an 80 Ohm termination resistance).

The configurable output path 500-*c* may illustrate an example of a mapping component 320 including a plurality of multiplexers configured to serialize a first subset of multiple bits of a memory word to a first pin (e.g., pin 345-*p*-1) and a second subset of the multiple bits of the memory word to a second pin (e.g., pin 345-*p*-2). In some examples, the first subset of the multiple bits and the second subset of the multiple bits may include interleaved subsets of bits of the memory word according to the order of the bits of the memory word.

In some examples, the configurable output path 500-*c* may include or be otherwise associated with a controller or circuitry that is configured to de-interleave the first subset of the multiple bits and the second subset of the multiple bits according to the order of the bits of the memory word. In some examples, the plurality of multiplexers may be configured for serializing according to a first clock rate (e.g., a 2-phase clock) or output rate, and the controller may be configured for conveying the bits of the memory word according to a second clock rate (e.g., a 4-phase clock) or output rate that is faster than the first clock rate or output rate. In some examples, the plurality of multiplexers may be configured for serializing according to a first burst length (e.g., 8 bits), and the controller may be configured for conveying the bits of the memory word according to a second burst length (e.g., 16 bits) that is different than the first burst length. In some examples, the controller may be configured to be coupled with a host device 105 via a quantity of pins of a data channel (e.g., 16 pins) that is fewer than a quantity of pins of the data channel interface (e.g., 32 pins).

Figure 6A:
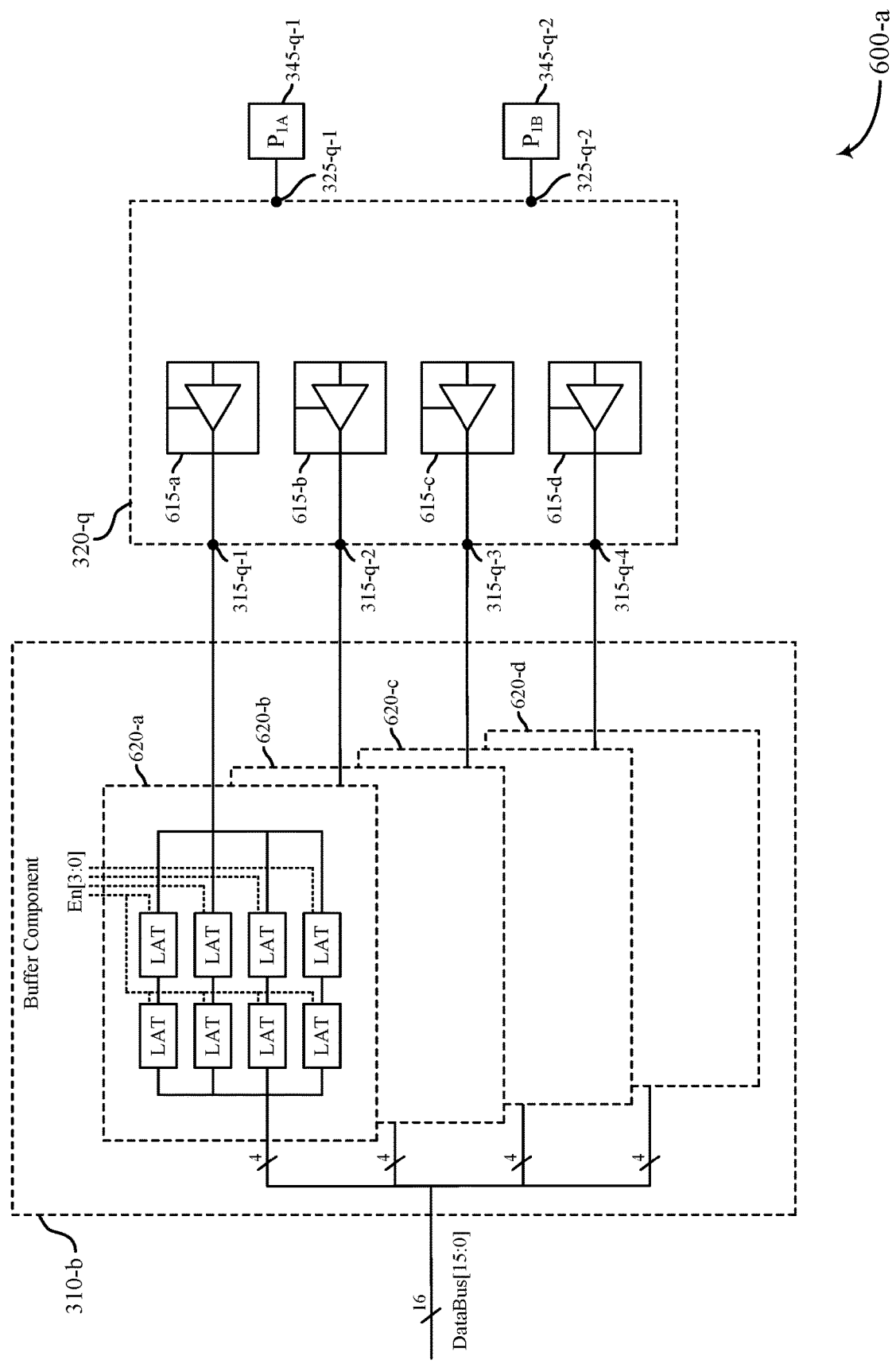
FIGS. 6A through 6C illustrate examples of a configurable input path that supports configurable link interfaces for a memory device in accordance with examples as disclosed herein.
Figure 6B:
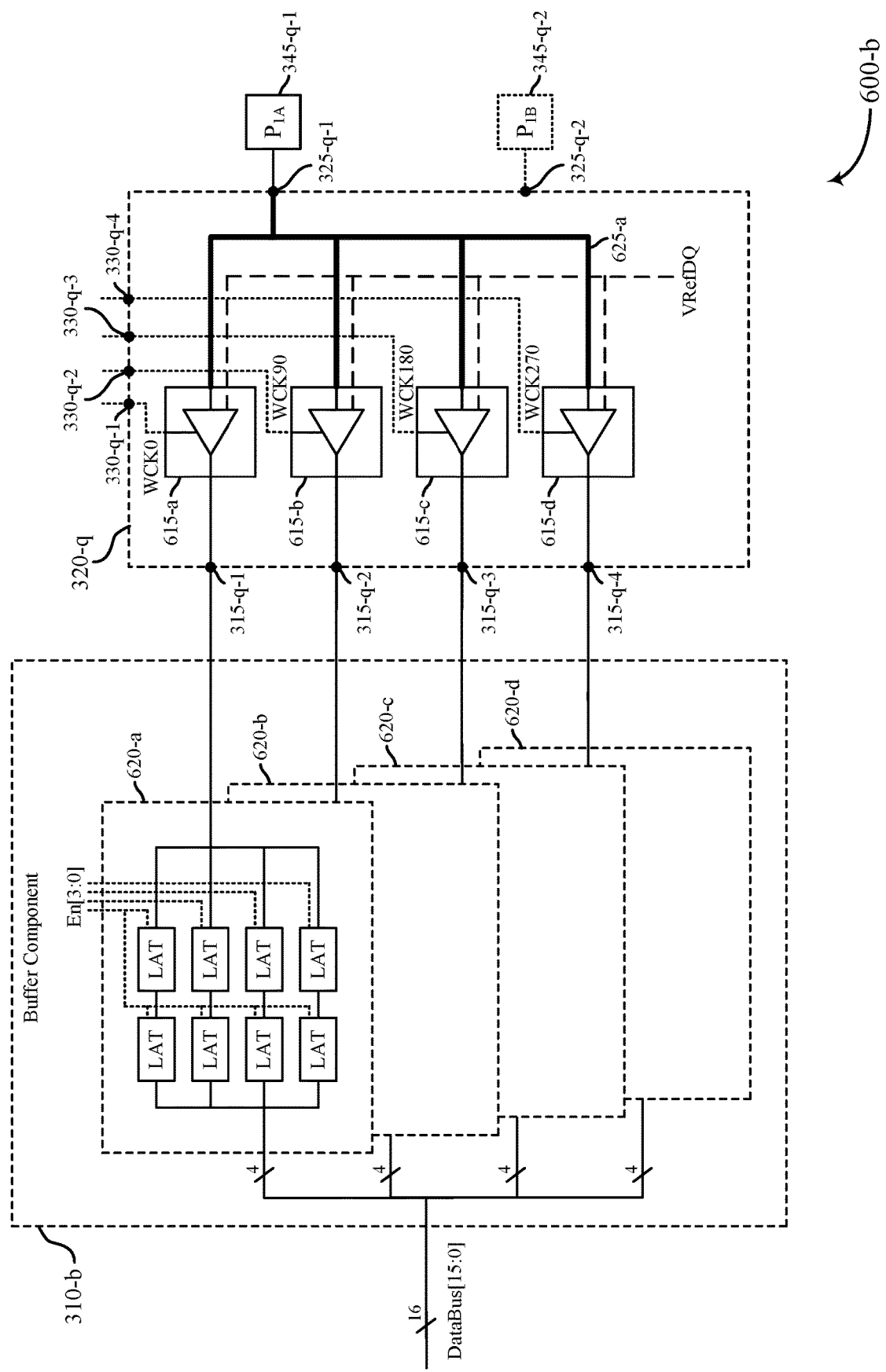
Figure 6C:
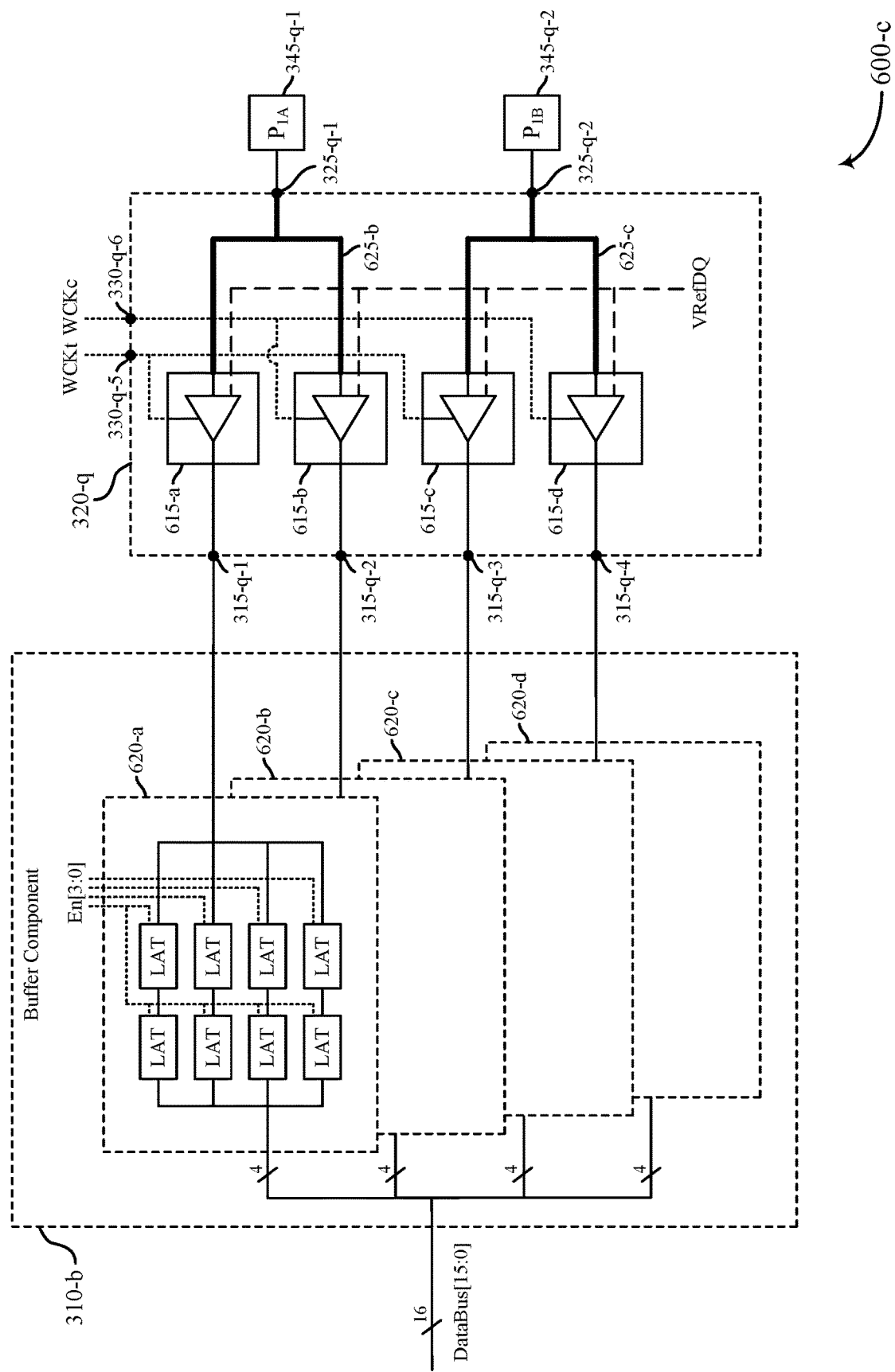

FIGS. 6A through 6C illustrate examples of a configurable input path 600 that supports configurable link interfaces for a memory device in accordance with examples as disclosed herein. The configurable input path 600 illustrates components that may be configured to support write operations (e.g., writing information to a memory array 170). The configurable output path 500 includes a buffer component 310-b that may be coupled with a memory array 170 (not shown), and a mapping component 320-q configurable to support different mappings between the illustrated nodes 315-q and 325-q. The configurable input path 600 illustrates an example of a single mapping component 320-q, but a configurable input path 600 may include any quantity of mapping components 320 to support various data bus widths. In some examples, aspects of the configurable input path 600 may be combined with aspects of the configurable output path 500 described with reference to FIGS. 5A through 5C (e.g., in a mapping component 320 that supports both read operations and write operations).

The buffer component 310-b may include a set of latch components 620 (e.g., latch components 620-a through 620-d). In some examples, each of the latch components 620 may be associated with four bits or columns of a memory word, and may be coupled with a memory array 170 via a respective data bus having a width of four bits. Thus, in the example of configurable input path 600, the buffer component 310-b may be coupled with a memory array 170 over a data bus having a total width of 16 bits. In the example of configurable input path 600, each of the latch components 620 may include four latches, each triggered by a respective signal of an enable bus En[3:0], for latching or deserializing information to be written to the memory array 170.

The mapping component 320-q may include a set of buffers 615 (e.g., buffers 615-a through 615-d), each of which may have an output coupled with a respective node 315-q. The outputs of the buffers 615 may thus be coupled with the memory array 170 (e.g., via latch components 620), and be configured to transmit logic state information to be written to the memory array 170. The buffers 615 may each be coupled with the node 325-q-1, or may each be coupled with the node 325-q-2, or divided between the node 325-q-1 and the node 325-q-2, according to various supported mapping configurations. For example, a first mapping may map the buffers 615-a through 615-d with the node 325-q-1, and a second mapping may divide the buffers 615-b through 615-d between the node 325-q-1 and the node 325-q-2. Although the example of mapping component 320-q includes four buffers 615, a mapping component 320 in accordance with the described techniques may include any quantity of buffers 615.

In some examples, the buffers 615 may be tri-state buffers having a respective control input. The respective control inputs may be provided with a clock signal according to various supported mapping configurations. For example, a first mapping may map the control inputs for the buffers 615 to one or more first clock signals associated with output of logic state information according to a first clock rate or data rate, and a second mapping may map the control inputs for the buffers 615 to one or more second clock signals associated with output of the logic state information according to a second clock rate or date rate that is different than the first clock rate or data rate.

FIG. 6A illustrates configurable input path 600-a, a configuration without interconnections between the components of the mapping component 320-q. In other words, configurable input path 600-a illustrates an example where a mapping between nodes 325-q and 315-q has not yet been established. In some examples, the configurable input path 600-a illustrates an intermediate fabrication configuration, such as a configuration which has not yet had an interconnecting metal layer deposited, or a configuration where interconnections by way of fuses or anti-fuses has not yet been established. Thus, the configurable input path 600-a illustrates an example of a configuration that may support one or a plurality of mappings between the nodes 325-q and the nodes 315-q.

FIG. 6B illustrates configurable input path 600-b, a configuration with a first mapping or interconnection between the components of the mapping component 320-q. In other words, configurable input path 600-b illustrates an example where a mapping between nodes 325-q and 315-q has been established. The configurable input path 600-b may correspond to the first mapping of mapping components 320 described with reference to FIG. 3, where each of the nodes 315-q-1 through 315-q-4 may be mapped to the node 325-q-1 (e.g., the pin 345-q-1, a single node or pin). In the example of configurable input path 600-b, the pin 345-q-2 may be idled, inactive, or disabled.

The mapping of configurable input path 600-b (e.g., of the mapping component 320-q) may be supported by way of an interconnection 625-a, which may illustrate an interconnection by way of a metal level, metal switches, fuses, anti-fuses, or other forms of interconnection, or various combinations thereof. In some examples, the configurable input path 600-b may illustrate an example of a mapping used to support a native LPDDR5 interface (e.g., according to an x16 DQ interface associated with 16 of the mapping components 320-q, 16 of the pins 345-q-1, and so on). In some examples, the configurable input path 600-b may be used to support a burst length of 16 bits, which may correspond to a data rate of 4800 Mbps on the pin 345-q-1.

The configurable input path 600-b may be associated with a 4-phase clock from a clock signal generator 350 to support a rate of input data deserialization (e.g., a demodulation rate) from the pins 345-q-1 that is two times as fast as an external clock signal, or four times as fast as an external clock signal, among other examples. For example, four phases of internal clock signals may be provided to the buffers 615 via respective clock nodes 330-q, with each of the clock signals triggering a respective one of the buffers 615. In some examples, clock signals of such a 4-phase clock may be configured to be half the rate of an input clock signal (e.g., WCK, or WCK_t), or one quarter of the rate of an input clock signal, among other examples. In some examples, the implementation of the 4-phase clock may involve link training to support a relatively high data rate. A data signal on the pin 345-$q$-1 may be triggered at one of buffers 615-$a$ through 615-$d$, and provided to a corresponding node 315-$q$ and a corresponding latch component 620 of the buffer component 310, supporting the writing of a word to a memory array 170 (e.g., via the data bus).

FIG. 6C illustrates configurable input path 600-$c$, a configuration with a second mapping or interconnection between the components of the mapping component 320-$q$. In other words, configurable input path 600-$c$ illustrates an example where a mapping between nodes 325-$q$ and 315-$q$ has been established. The configurable input path 600-$c$ may correspond to the second mapping of mapping components 320 described with reference to FIG. 3, where the nodes 315-$q$-1 through 315-$q$-4 may be mapped to either the node 325-$q$-1 (e.g., the pin 345-$q$-1) or the node 325-$q$-2 (e.g., the pin 345-$q$-2).

The mapping of configurable input path 600-$c$ (e.g., of the mapping component 320-$q$) may be supported by way of interconnections 625-$b$ and 625-$c$, which may illustrate interconnections by way of a metal layer, metal switches, fuses, anti-fuses, or other forms of interconnection, or various combinations thereof. In some examples, the configurable input path 600-$c$ may illustrate an example of a mapping used to support a custom interface (e.g., according to an x32 DQ interface associated with 32 of the mapping components 320-$q$, 32 of the pins 345-$q$-1, and so on). In some examples, the configurable input path 600-$c$ may be used to support a burst length of 8 bits, which may correspond to a data rate of 2400 Mbps on each of the pins 345-$q$-1 and 345-$q$-2, for an aggregate throughput of 4800 Mbps via the mapping component 320-$q$.

The configurable input path 600-$c$ may be associated with a 2-phase clock from a clock signal generator 350 to support a rate of output data deserialization (e.g., a demodulation rate) on each of the pins 345-$q$-1 and 345-$q$-2 that is two times as fast as an external clock signal, among other examples. For example, two phases of internal clock signals may be provided to the buffers 615 via respective clock nodes 330-$q$, with each of the clock signals triggering two of the buffers 615. In some examples, each of the clock signals of such a 2-phase clock may be configured with a same rate as an input clock signal. In some examples, the implementation of the 2-phase clock may not involve link training to support a relatively high data rate. A first data signal on the pin 345-$q$-1 may be triggered at one of buffers 615-$a$ or 615-$b$, and provided to a corresponding node 315-$q$ and a corresponding latch component 620 of the buffer component 310. A second data signal on the pin 345-$q$-2 may be triggered at one of buffers 615-$c$ or 615-$d$, and provided to a corresponding node 315-$q$ and a corresponding latch component 620 of the buffer component 310. Thus, the combination of signaling on the pins 345-$q$-1 and 345-$q$-2, via a split input path, may support the writing of a word to a memory array 170 (e.g., via the data bus).

The configurable input path 600-$c$ may illustrate an example of a mapping component 320 including a plurality of demultiplexers configured to deserialize a first subset of multiple bits of a memory word from a first pin (e.g., pin 345-$q$-1) and a second subset of the multiple bits of the memory word from a second pin (e.g., pin 345-$q$-2). In some examples, the first subset of the multiple bits and the second subset of the multiple bits may include interleaved subsets of bits of the memory word according to the order of the bits of the memory word.

In some examples, the configurable input path 600-$c$ may include or be otherwise associated with a controller or circuitry that is configured to interleave the first subset of the multiple bits and the second subset of the multiple bits according to the order of the bits of the memory word. In some examples, the plurality of multiplexers may be configured for deserializing according to a first clock rate (e.g., a 2-phase clock) or data rate, and the controller may be configured for conveying the bits of the memory word according to a second clock rate (e.g., a 4-phase clock) or data rate that is faster than the first clock rate or data rate. In some examples, the plurality of multiplexers may be configured for deserializing according to a first burst length (e.g., 8 bits), and the controller may be configured for conveying the bits of the memory word according to a second burst length (e.g., 16 bits) that is greater than the first burst length, or a second burst length that is equal to the first burst length. In some examples, the controller may be configured to be coupled with a host device 105 via a quantity of pins of a data channel (e.g., 16 pins) that is fewer than a quantity of pins of the data channel interface (e.g., 32 pins).

It should be noted that the techniques described above describe possible implementations, and that the circuitry and operations thereof may be rearranged or otherwise modified and that other implementations are possible. Furthermore, portions from two or more of the techniques or operations may be combined.

An apparatus is described. The apparatus may include a memory array including a set of memory cells, and a set of buffers having respective data inputs coupled with the memory array and configured to receive logic state information from the memory array. Each of the set of buffers may have a control input. The apparatus may also include a data channel interface including a set of pins configured to convey the logic state information. The apparatus may also include a set of nodes configured to support a first mapping between the set of buffers and the data channel interface and a second mapping between the set of buffers and the data channel interface. In some examples, the first mapping maps the set of buffers to a first quantity of the set of pins, and maps the control inputs for the set of buffers to one or more first clock signals associated with output of the logic state information according to a first clock rate. In some examples, the second mapping maps the set of buffers to a second quantity of the set of pins that is different than the first quantity, and maps the control inputs for the set of buffers to one or more second clock signals associated with output of the logic state information according to a second clock rate that is different than the first clock rate.

Some examples of the apparatus may include a set of output drivers coupled between the set of buffers and the data channel interface. In some examples, the first mapping maps the plurality of output drivers to the first quantity of the plurality of pins, and the second mapping maps the plurality of output drivers to the second quantity of the plurality of pins In some examples, the first mapping may be associated with a first burst length corresponding to a first quantity of bits of information output at each pin of the first quantity of the set of pins for a read operation. In some examples, the second mapping may be associated with a second burst length corresponding to a second quantity of bits of information output at each pin of the second quantity of the set of pins for the read operation, that may be different than the first quantity of bits.

Some examples of the apparatus may include a metal level of the apparatus coupling the set of nodes according to the first mapping. Some examples of the apparatus may include a metal level of the apparatus coupling the set of nodes according to the second mapping. Some examples of the apparatus may include a metal level of the apparatus coupling an external clock input of the apparatus with a clock signal generation component configured to generate the one or more first clock signals based on a first quantity of divided phases of the external clock input. Some examples of the apparatus may include a metal level of the apparatus coupling an external clock input of the apparatus with a clock signal generation component configured to generate the one or more second clock signals based on a second quantity of divided phases of the external clock input. Some examples of the apparatus may include a set of fuses, anti-fuses, or a combination thereof, configured to couple the set of nodes according to the first mapping or the second mapping.

Another apparatus is described. The apparatus may include a memory array including a set of memory cells arranged as a set of rows and a set of columns, and a read circuit configured to read, from the memory array, a memory word including bits arranged according to an order of the set of columns. The apparatus may also include a data channel interface including a set of pins configured to convey the bits of the memory word, where the set of pins are grouped into a set of groups of adjacent pins, and a set of multiplexers between the read circuit and the data channel interface. The set of multiplexers may be configured to serialize, for each group of the set of groups, a first subset of multiple bits of the memory word to a first pin and a second subset of the multiple bits of the memory word to a second pin, where the first subset of the multiple bits and the second subset of the multiple bits may include interleaved subsets of bits of the memory word according to the order of the bits of the memory word.

Some examples of the apparatus may include a controller coupled with the data channel interface. For each group of the set of groups, the controller may be configured to de-interleave the first subset of the multiple bits and the second subset of the multiple bits according to the order of the bits of the memory word.

In some examples, the set of multiplexers may be configured for serializing according to a first clock rate, and the controller may be configured for conveying the bits of the memory word according to a second clock rate that is faster than the first clock rate.

In some examples, the set of multiplexers may be configured for serializing according to a first burst length, and the controller may be configured for conveying the bits of the memory word according to a second burst length that is different than the first burst length.

In some examples, the controller may be configured to be coupled with a host device via a quantity of pins of a data channel that is fewer than a quantity of pins of the data channel interface.

Another apparatus is described. The apparatus may include a memory array including a set of memory cells, and a set of latches having respective data outputs coupled with the memory array and configured to output logic state information for writing to the memory array. Each of the set of latches may have a control input. The apparatus may also include a data channel interface including a set of pins configured to convey the logic state information. The apparatus may also include a set of nodes configured to support a first mapping between the data channel interface and the set of latches and a second mapping between the data channel interface and the set of latches. In some examples, the first mapping maps the set of latches with a first quantity of the set of pins, and maps the control inputs for the set of latches to one or more first clock signals associated with input of the logic state information according to a first clock rate. In some examples, the second mapping maps the set of latches with a second quantity of the set of pins that is different than the first quantity, and maps the control inputs for the set of latches to one or more second clock signals associated with input of the logic state information according to a second clock rate that is different than the first clock rate.

In some examples, the one or more first clock signals associated with input of the logic state information according to the first clock rate may be associated with a first quantity of divided phases of an external clock input. In some examples, the one or more second clock signals associated with input of the logic state information according to the second clock rate may be associated with a second quantity of divided phases of the external clock input that is different than the first quantity of divided phases.

In some examples, the first mapping may be associated with a first burst length corresponding to a first quantity of bits of write information at each pin of the first quantity of the set of pins. In some examples, the second mapping may be associated with a second burst length corresponding to a second quantity of bits of write information, at each pin of the second quantity of the set of pins, that is different than the first quantity of bits.

Some examples of the apparatus may include a metal level of the apparatus coupling the set of nodes according to the first mapping and coupling the control inputs to a first set of clock signals. Some examples of the apparatus may include a metal level of the apparatus coupling the set of nodes according to the second mapping and coupling the control inputs to a second set of clock signals. Some examples of the apparatus may include a set of fuses, anti-fuses, or a combination thereof, configured to couple the set of nodes according to the first mapping or the second mapping.

Another apparatus is described. The apparatus may include a memory array including a set of memory cells arranged as a set of rows and a set of columns of memory cells, and a write circuit configured to write a memory word to the memory array, where bits of the memory word are arranged according to an order of the set of columns. The apparatus may also include a data channel interface including a set of pins configured to receive the bits of the memory word, where the set of pins are grouped into a set of groups of adjacent pins, and a set of demultiplexers between the data channel interface and the write circuit. The set of demultiplexers may be configured to deserialize, for each group of the set of groups, a first subset of multiple bits of the memory word from a first pin and a second subset of the multiple bits of the memory word from a second pin, where the first subset of the multiple bits and the second subset of the multiple bits include interleaved subsets of bits of the memory word according to the order of the bits of the memory word.

Some examples of the apparatus may include a controller coupled with the data channel interface. For each group of the set of groups, the controller may be configured to interleave the first subset of the multiple bits and the second subset of the multiple bits according to the order of the bits of the memory word.

In some examples, the set of demultiplexers may be configured for deserializing according to a first clock rate, and the controller may be configured for conveying the bits of the memory word according to a second clock rate that may be faster than the first clock rate.

In some examples, the set of demultiplexers may be configured for deserializing according to a first burst length, and the controller may be configured for conveying the bits of the memory word according to a second burst length that may be equal to the first burst length.

In some examples, the controller may be configured to be coupled with a host device via a quantity of pins of a data channel that may be fewer than a quantity of pins of the data channel interface.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive.

A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    providing a memory die comprising:
        a memory array having a plurality of memory cells;
        a plurality of buffers configured to communicate logic state information with the memory array; and
        a data channel interface comprising a plurality of pins configured to convey the logic state information, wherein the memory die supports a plurality of mappings between the plurality of buffers and a respective set of pins of the plurality of pins, the plurality of mappings comprising:
            a first mapping that maps the plurality of buffers to a first quantity of the plurality of pins in accordance with a first burst length; and
            a second mapping that maps the plurality of buffers to a second quantity of the plurality of pins in accordance with a second burst length, wherein the second quantity of pins is less than the first quantity of pins and the second burst length is greater than the first burst length; and
    performing a configuration operation on the provided memory die to establish the first mapping or the second mapping.

2. The method of claim 1, wherein the first burst length and the second burst length are associated with a same duration relative to a clock speed.

3. The method of claim 1, wherein the provided memory die further comprises a mapping component that supports the plurality of mappings between the plurality of buffers and the respective set of pins, and wherein performing the configuration operation comprises:
    configuring one or more interconnections between components of the mapping component.

4. The method of claim 1, wherein the provided memory die further comprises one or more fuses, one or more anti-fuses, or a combination thereof, and wherein performing the configuration operation comprises:
    configuring the one or more fuses, the one or more anti-fuses, or the combination thereof.

5. The method of claim 1, wherein performing the configuration operation comprises:
    depositing an interconnecting metal layer on the memory die.

6. The method of claim 5, wherein depositing the interconnecting metal layer comprises:
    forming a metal coupling an external clock input of the memory die with a clock signal generation component configured to generate one or more first clock signals associated with the first mapping based at least in part on a first quantity of divided phases of the external clock input or to generate one or more second clock signals associated with the second mapping based at least in part on a second quantity of divided phases of the external clock input.

7. The method of claim 1, wherein:
    the first mapping maps control inputs for the plurality of buffers to one or more first clock signals associated with output of the logic state information according to a first clock rate; and
    the second mapping maps the control inputs for the plurality of buffers to one or more second clock signals associated with output of the logic state information according to a second clock rate that is different than the first clock rate.

8. A method, comprising:
    providing a memory die comprising:
        a memory array having a plurality of memory cells;
        a plurality of buffers configured to communicate logic state information with the memory array; and
        a data channel interface comprising a plurality of pins configured to convey the logic state information, wherein the memory die supports a plurality of mappings between the plurality of buffers and a respective set of pins of the plurality of pins, the plurality of mappings comprising:
  a first mapping that maps the plurality of buffers to a first quantity of the plurality of pins in accordance with a first burst length; and
  a second mapping that maps the plurality of buffers to a second quantity of the plurality of pins in accordance with a second burst length, wherein the second quantity of pins is less than the first quantity of pins and the second burst length is greater than the first burst length; and
performing a configuration operation on the provided memory die to establish the first mapping or the second mapping.

9. The method of claim 8, wherein the first burst length and the second burst length are associated with a same duration relative to a clock speed.

10. The method of claim 8, wherein the provided memory die further comprises a mapping component that supports the plurality of mappings between the plurality of buffers and the respective set of pins, and wherein performing the configuration operation comprises:
  configuring one or more interconnections between components of the mapping component.

11. The method of claim 8, wherein the provided memory die further comprises one or more fuses, one or more anti-fuses, or a combination thereof, and wherein performing the configuration operation comprises:
  configuring the one or more fuses, the one or more anti-fuses, or the combination thereof.

12. The method of claim 8, wherein performing the configuration operation comprises:
  depositing an interconnecting metal layer on the memory die.

13. The method of claim 12, wherein depositing the interconnecting metal layer comprises:
  forming a metal coupling an external clock input of the memory die with a clock signal generation component configured to generate one or more first clock signals associated with the first mapping based at least in part on a first quantity of divided phases of the external clock input or to generate one or more second clock signals associated with the second mapping based at least in part on a second quantity of divided phases of the external clock input.

14. The method of claim 8, wherein:
the first mapping maps control inputs for the plurality of buffers to one or more first clock signals associated with output of the logic state information according to a first clock rate; and
the second mapping maps the control inputs for the plurality of buffers to one or more second clock signals associated with output of the logic state information according to a second clock rate that is different than the first clock rate.

15. A memory device, formed by a process comprising:
providing a memory die comprising:
  a memory array having a plurality of memory cells;
  a plurality of buffers configured to communicate logic state information with the memory array; and
  a data channel interface comprising a plurality of pins configured to convey the logic state information, wherein the memory die supports a plurality of mappings between the plurality of buffers and a respective set of pins of the plurality of pins, the plurality of mappings comprising:
    a first mapping that maps the plurality of buffers to a first quantity of the plurality of pins in accordance with a first burst length; and
    a second mapping that maps the plurality of buffers to a second quantity of the plurality of pins in accordance with a second burst length, wherein the second quantity of pins is less than the first quantity of pins and the second burst length is greater than the first burst length; and
performing a configuration operation on the provided memory die to establish the first mapping or the second mapping.

16. The memory device of claim 15, wherein the first burst length and the second burst length are associated with a same duration relative to a clock speed.

17. The memory device of claim 15, further comprising:
providing the memory die comprising a mapping component that supports the plurality of mappings between the plurality of buffers and the respective set of pins, wherein performing the configuration operation comprises:
  configuring one or more interconnections between components of the mapping component.

18. The memory device of claim 15, further comprising:
providing the memory die comprising one or more fuses, one or more anti-fuses, or a combination thereof, wherein performing the configuration operation comprises:
  configuring the one or more fuses, the one or more anti-fuses, or the combination thereof.

19. The memory device of claim 15, wherein performing the configuration operation comprises:
depositing an interconnecting metal layer on the memory die.

20. The memory device of claim 15, wherein:
the first mapping maps control inputs for the plurality of buffers to one or more first clock signals associated with output of the logic state information according to a first clock rate; and
the second mapping maps the control inputs for the plurality of buffers to one or more second clock signals associated with output of the logic state information according to a second clock rate that is different than the first clock rate.

* * * * *